US009576952B2

(12) United States Patent
Joshi et al.

(10) Patent No.: US 9,576,952 B2
(45) Date of Patent: Feb. 21, 2017

(54) INTEGRATED CIRCUITS WITH VARYING GATE STRUCTURES AND FABRICATION METHODS

(71) Applicant: GLOBALFOUNDRIES Inc., Grand Cayman (KY)

(72) Inventors: Manoj Joshi, Clifton Park, NY (US); Manfred Eller, Beacon, NY (US); Richard J. Carter, Saratoga Springs, NY (US); Srikanth Balaji Samavedam, Cohoes, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 90 days.

(21) Appl. No.: 14/188,778

(22) Filed: Feb. 25, 2014

(65) Prior Publication Data

US 2015/0243658 A1      Aug. 27, 2015

(51) Int. Cl.
*H01L 27/088*      (2006.01)
*H01L 21/8234*      (2006.01)
(Continued)

(52) U.S. Cl.
CPC ..... *H01L 27/0886* (2013.01); *H01L 21/82345* (2013.01); *H01L 21/823431* (2013.01);
(Continued)

(58) Field of Classification Search
CPC ............... H01L 21/823431; H01L 21/823821; H01L 21/845; H01L 27/0886; H01L 27/0924; H01L 27/1211; H01L 29/41791; H01L 29/66795; H01L 29/785
(Continued)

(56) References Cited

U.S. PATENT DOCUMENTS

| | | |
|---|---|---|
| 6,448,590 B1 | 9/2002 | Adkisson et al. |
| 6,797,553 B2 | 9/2004 | Adkisson et al. |
| (Continued) | | |

FOREIGN PATENT DOCUMENTS

WO      2009053251 A1      4/2009

OTHER PUBLICATIONS

Zang et al., "Multiple Threshold Voltage Semiconductor Device", U.S. Appl. No. 14/245,656, filed Apr. 4, 2014, 29 pages.
Joshi et al., "Integration Method for Fabrication of Metal Gate Based Multiple Threshold Voltage Devices and Circuits", U.S. Appl. No. 14/188,898, filed Feb. 25, 2014, 58 pages.
(Continued)

*Primary Examiner* — Jerome Jackson, Jr.
*Assistant Examiner* — David Spalla
(74) *Attorney, Agent, or Firm* — Heslin Rothenberg Farley & Mesiti P.C.; Kristian E. Ziegler

(57) ABSTRACT

Integrated circuits and fabrication methods are provided. The integrated circuit includes: a varying gate structure disposed over a substrate structure, the varying gate structure including a first gate stack in a first region of the substrate structure, and a second gate stack in a second region of the substrate structure; a first field-effect transistor in the first region, the first field-effect transistor including the first gate stack and having a first threshold voltage; and a second field-effect transistor in the second region, the second field-effect transistor including the second gate stack and having a second threshold voltage, where the first threshold voltage is different from the second threshold voltage. The methods include providing the varying gate structure, the providing including: sizing layer(s) of the varying gate structure with different thickness(es) in different region(s).

20 Claims, 13 Drawing Sheets

(51) Int. Cl.
   *H01L 21/8238*    (2006.01)
   *H01L 27/092*     (2006.01)
(52) U.S. Cl.
   CPC ............. *H01L 21/823821* (2013.01); *H01L 21/823842* (2013.01); *H01L 27/0922* (2013.01); *H01L 27/0924* (2013.01)
(58) Field of Classification Search
   USPC .................................................. 257/391, 392
   See application file for complete search history.

(56) References Cited

U.S. PATENT DOCUMENTS

| | | | | |
|---|---|---|---|---|
| 8,252,649 | B2* | 8/2012 | Stahrenberg | H01L 21/82345 438/275 |
| 8,357,581 | B2 | 1/2013 | Masuoka et al. | |
| 8,445,344 | B2 | 5/2013 | Carter et al. | |
| 2010/0308418 | A1* | 12/2010 | Stahrenberg | H01L 21/82345 257/392 |
| 2010/0327373 | A1* | 12/2010 | Carter | H01L 21/28088 257/392 |
| 2014/0061814 | A1* | 3/2014 | Kim | H01L 21/82385 257/369 |
| 2014/0203243 | A1* | 7/2014 | Xiao | H01L 29/66795 257/24 |

OTHER PUBLICATIONS

Lee et al., "Integrated Circuit Having Multiple Threshold Voltages", U.S. Appl. No. 14/189,085, filed Feb. 25, 2014, 57 pages.

* cited by examiner

INTEGRATED CIRCUITS WITH VARYING GATE STRUCTURES AND FABRICATION METHODS

FIELD OF THE INVENTION

The present invention relates to semiconductor devices and methods of manufacturing semiconductor devices, and more particularly, to integrated circuits and methods for fabricating integrated circuits with varying gate structures.

BACKGROUND OF THE INVENTION

Different semiconductor devices may be fabricated to have one or more different device characteristics, such as threshold voltage, switching speed, leakage power consumption, etc. Multiple different designs may each provide optimization of one or more of these characteristics for devices intended to perform specific functions. For instance, one design may have reduced threshold voltage to increase switching speed for devices providing computational logic functions, and another design may have increased threshold voltage to decrease power consumption for devices providing memory storage functions. A system using multiple discrete devices, each optimized for different functions, will result in greater system complexity, increased system footprint, and added system cost.

BRIEF SUMMARY

The shortcomings of the prior art are overcome, and additional advantages are provided, through the provision, in one aspect, of an integrated circuit. The integrated circuit includes a varying gate structure disposed over a substrate structure, the varying gate structure having a first gate stack in a first region of the substrate structure, and a second gate stack in a second region of the substrate structure; a first field-effect transistor in the first region of the substrate structure, the first field-effect transistor including the first gate stack of the varying gate structure and having a first threshold voltage; and a second field-effect transistor in the second region of the substrate structure, the second field-effect transistor including the second gate stack of the varying gate structure and having a second threshold voltage, where the first threshold voltage is different from the second threshold voltage.

In another aspect, a method for fabricating an integrated circuit is presented herein. The method includes providing a varying gate structure disposed over a substrate structure, the varying gate structure having a first gate stack in a first region of the substrate structure and a second gate stack in a second region of the substrate structure, and the providing including: sizing one layer of the varying gate structure with a first thickness in the first region of the substrate structure and a second thickness in the second region of the substrate structure; and sizing another layer of the varying gate structure with a third thickness in the first region of the substrate structure and a fourth thickness in the second region of the substrate structure, where the first thickness is different from the second thickness, and the third thickness is different from the fourth thickness.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
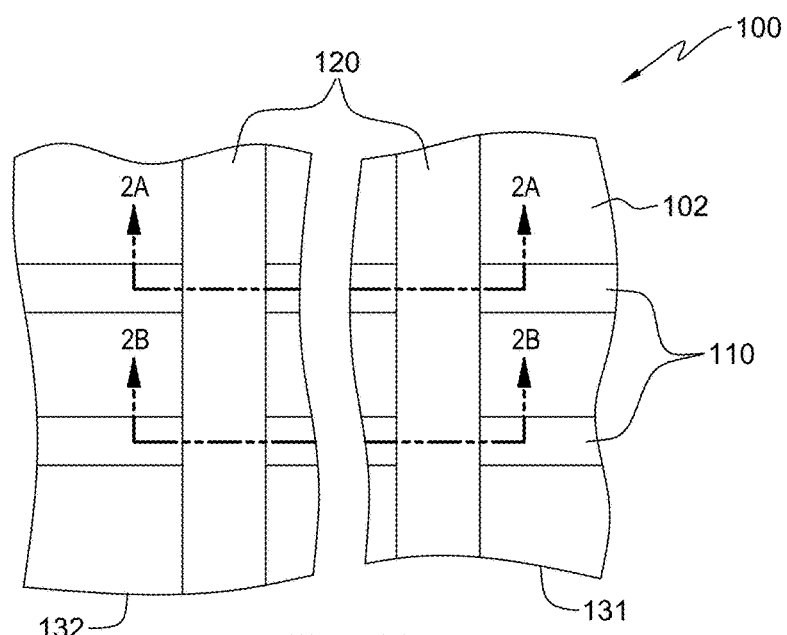
FIG. 1A is a plan view of one embodiment of an intermediate circuit structure obtained during circuit fabrication, and depicts a varying gate structure disposed over a substrate structure, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, integrated circuits, including field-effect transistors (FETs), having a varying gate structure and multiple different threshold voltages. During integrated circuit fabrication, numerous gates for numerous FETs may be desired in a single process which provides one or more gate structures above selected regions of an entire substrate of the integrated circuit. For instance, a layered gate structure, having a uniform stack of layers of materials, may be provided above the selected regions of the entire substrate to form numerous gates for numerous FETs. As used herein, a varying gate structure refers to a gate structure that has multiple different stacks of layers, or multiple different gate stacks, that may have different compositions or sizes, in different regions of the integrated circuit. In one example, such a varying gate structure may have different material layers of different thicknesses in the same or different regions. In another example, such a varying gate structure may have a different number of material layers in different regions. By using a varying gate structure as described herein, numerous gates with different gate stacks may be formed in a single process.

In a FET, the threshold voltage is the minimum gate voltage required to allow current to flow from a source to a drain through a channel of the FET. Controlling for other factors, in general, a FET with a lower threshold voltage operates faster, but consumes more leakage power, than a FET with higher threshold voltage.

When designing integrated circuits, including, for example, systems on a chip, for use in specific applications, such as mobile phones or media players, it may be desirable to optimize leakage power consumption and speed of the integrated circuit by having different portions of the integrated circuit implemented with FETs having different threshold voltages. For example, it may be desirable to perform logic or arithmetic functions at a relatively higher speed to enable advanced features, and to perform memory storage at a relatively lower speed to save power. In another example, even within a single logic subsystem of an integrated circuit, it may be desirable to optimize the speed of certain FETs and optimize the power consumption of other FETs.

In addition, because modern integrated circuit designs rely on complementary metal oxide semiconductor (CMOS) technology, using both n-type FETs (NFETs) and p-type FETs (PFETs), integrated circuits combining NFETs and PFETs with multiple threshold voltages are desirable.

Generally stated, provided herein, in one aspect, is an integrated circuit. The integrated circuit includes a varying gate structure disposed over a substrate structure, the varying gate structure having a first gate stack in a first region of the substrate structure, and a second gate stack in a second region of the substrate structure; a first field-effect transistor in the first region of the substrate structure, the first field-effect transistor including the first gate stack of the varying gate structure and having a first threshold voltage; and a second field-effect transistor in the second region of the substrate structure, the second field-effect transistor including the second gate stack of the varying gate structure and having a second threshold voltage, where the first threshold voltage is different from the second threshold voltage. In one example, a portion of the varying gate structure extends from the first field-effect transistor to the second field-effect transistor. In another example, the first threshold voltage may be between 80 and 120 millivolts greater than the second threshold voltage. In a further example, the one layer of the varying gate structure comprises a work-function layer, and the other layer of the varying gate structure comprises a cap layer, and the varying gate structure further comprises a gate dielectric layer disposed below the cap layer.

In one embodiment, the varying gate structure may include one layer and another layer, the one layer having a first thickness in the first region of the substrate structure and a second thickness in the second region of the substrate structure, and the other layer having a third thickness in the first region of the substrate structure and a fourth thickness in the second region of the substrate structure, where the first thickness is different from the second thickness, and the third thickness is different from the fourth thickness. In such a case, the first thickness is less than the second thickness, and the third thickness is greater than the fourth thickness.

In another embodiment, the substrate structure may include a first fin extending over the first region of the substrate structure and a second fin extending over the second region of the substrate structure, and the varying gate structure may be conformally disposed over the first fin and the second fin. In such a case, the first fin and the second fin may be a common fin.

A method for fabricating an integrated circuit is also provided herein. The method includes providing a varying gate structure disposed over a substrate structure, the varying gate structure having a first gate stack in a first region of the substrate structure and a second gate stack in a second region of the substrate structure, and the providing including: sizing one layer of the varying gate structure with a first thickness in the first region of the substrate structure and a second thickness in the second region of the substrate structure; and sizing another layer of the varying gate structure with a third thickness in the first region of the substrate structure and a fourth thickness in the second region of the substrate structure, where the first thickness is different from the second thickness, and the third thickness is different from the fourth thickness.

In one example, the integrated circuit includes a first field-effect transistor in the first region of the substrate structure, and a second field-effect transistor in the second region of the substrate structure, the first field-effect transistor including the first gate stack and having a first threshold voltage, and the second field-effect transistor including the second gate stack and having a second threshold voltage, where the first threshold voltage is different from the second threshold voltage. In another example, a third region of the substrate structure includes a portion of the first region and another portion of the second region, and the providing further includes, after sizing the one layer of the varying gate structure, resizing the one layer in the third region of the substrate structure with a fifth thickness.

In one embodiment, sizing the one layer of the varying gate structure may include: depositing, at least partially, a material of the one layer over the first region and the second region of the substrate structure; removing, at least partially, the material from the first region of the substrate structure; and depositing again, at least partially, the material over the first region and the second region of the substrate structure to form the first thickness of the one layer in the first region, and the second thickness of the one layer in the second region.

In another embodiment, the substrate structure includes one or more fins extending over the first region and the second region thereof, and providing the varying gate structure includes providing the varying gate structure conformally over the one or more fins. In such a case, the integrated circuit may include a first field-effect transistor in the first region of the substrate structure and a second field-effect transistor in the second region of the substrate structure, the first field-effect transistor including the first gate stack and a first fin of the one or more fins, and having a first threshold voltage, and the second field-effect transistor including the second gate stack and a second fin of the one or more fins, and having a second threshold voltage, where the first threshold voltage is different from the second threshold voltage.

Reference is made below to the drawings, which are not drawn to scale for ease of understanding, wherein the same reference numbers used throughout different figures designate the same or similar components.

FIG. 1A illustrates one embodiment of an intermediate circuit structure 100 obtained during circuit fabrication, in accordance with one or more aspects of the present invention. In one example, as depicted, a gate structure 120 is disposed over a substrate structure. As depicted, in one example, the substrate structure may include a substrate 102 and one or more fins 110, supporting the formation of fin-type field-effect transistors (Fin FETs) and planar FETs.

Gate structure 120 may extend conformally over (and partially wrap around) the one or more fins 110. In one example, a replacement gate process may be employed, wherein a sacrificial gate of an appropriate material, such as polycrystalline silicon (polysilicon), may be provided at an early stage of circuit fabrication, and then later removed and replaced with a final gate structure. In another example, the gate structure may be formed directly without the use of a sacrificial gate. In either gate process, the gate structure may be formed either before (gate-first) or after (gate-last) the formation of a source region and a drain region of field effect transistors, depending upon the process flow selected.

Substrate 102 may be (in one example) a bulk semiconductor material such as a bulk silicon wafer. As another example, substrate 102 may be or include any silicon-containing substrate including, but not limited to, single crystal Si, polycrystalline Si, amorphous Si, Si-on-nothing (SON), Si-on-insulator (SOI), or Si-on-replacement insulator (SRI) substrates and the like, and may be n-type or p-type doped as desired for a particular application. In one example, substrate 102 may be, for instance, a wafer or substrate approximately 600-700 micrometers thick, or less.

Fins 110 may extend from substrate 102, and may include one or more fins in first region 131 and one or more fins in second region 132. By way of example, fins may be formed by removing one or more portions of the substrate to create the fins from the same material as the substrate, such as, for example, a semiconductor or crystalline material. In one example, formation of fins may be achieved by patterning the substrate using any of various approaches, including: direct lithography; sidewall image transfer technique; extreme ultraviolet lithography (EUV); e-beam technique; litho-etch litho-etch; or litho-etch litho-freeze. Following patterning, material removal may be performed, for example, by any suitable etching process, such as an anisotropic dry etching process, for instance, reactive-ion-etching (RIE) in sulfur hexafluoride ($SF_6$). Although the following numbers are relative and the heights could vary, as one specific example, fins may have a height of about 40 nanometers, and a length of about one micrometer, several micrometers, or the diameter of the entire wafer, and the thickness of fins may be approximately 10 nanometers or less. In another example, the fins may be formed on the substrate, and the fins and the substrate may be different materials.

Figure 1B:
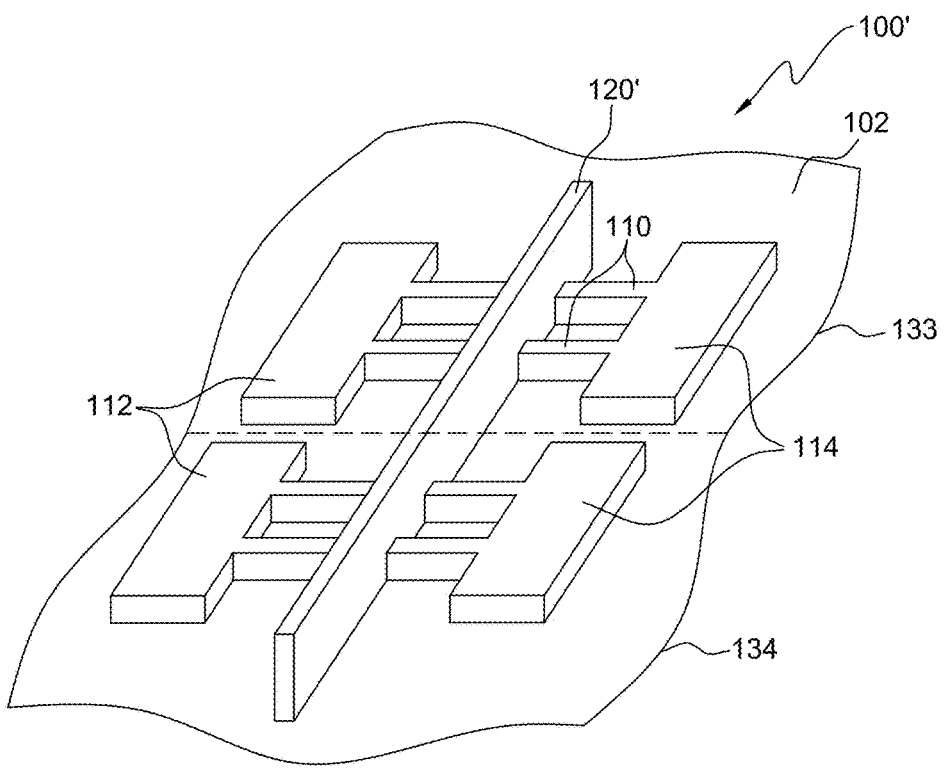
FIG. 1B is an isometric view of one embodiment of an integrated circuit, in accordance with one or more aspects of the present invention.

Referring to FIG. 1B, one embodiment of an integrated circuit 100' having two field-effect transistors (FETs) is illustrated to provide overall context regarding the present invention. As shown, a portion of gate structure 120' may extend from a first FET in region 133 to a second FET in region 134, and each FET may include two fins 110. In a typical integrated circuit, thousands, millions, or more, FETs may be interconnected. In complementary metal-oxide-semiconductor (CMOS) technology, n-type FETs (NFETs) may be interconnected with p-type FETs (PFETs), for example, by sharing a common gate structure, or may be connected by metal contacts (not shown). Each FET may include, for instance, any number of fins, depending on the desired circuit design, because having more fins may allow the FET to carry a greater current from a source 112 to a drain 114. For example, as depicted each FET has two fins. In a given integrated circuit, there may be a variety of FETs having varying numbers of fins interspersed throughout the integrated circuit.

For reasons explained above, it may be desirable for different FETs of an integrated circuit to have different threshold voltages. As disclosed herein, a varying gate structure having different gate stacks in different regions may allow for different threshold voltages to be selected for FETs in those different regions. In addition, because of the different electrical characteristics of NFETs and PFETs, the varying gate structure may allow for the same or similar threshold voltages to be selected for NFETs and PFETs, including NFETs and PFETs directly connected by a portion of the varying gate structure. In some cases, there may be a requirement for six or more different threshold voltages. For example, a CMOS integrated circuit may require a pair of regular threshold voltages, a pair of low threshold voltages, and a pair of super-low threshold voltages, with each pair providing a threshold voltage for each of NFETs and PFETs.

Gate structure 120' may be formed, for example, using the techniques disclosed herein, and may have one gate stack in region 133 and a different gate stack in region 134, allowing for different threshold voltages to be selected for FETs in those different regions. In another example, a varying gate structure that has different gate stacks in region 133 and region 134 may allow for the same (or a similar) threshold voltage to be selected for an NFET in region 133 and a PFET in region 134.

Figure 2A:
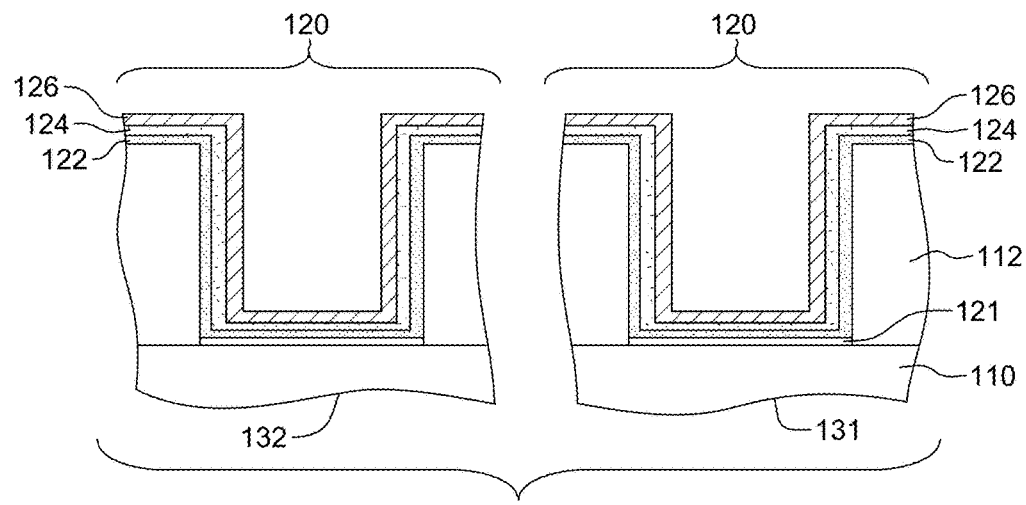
FIGS. 2A-2B are cross-sectional elevation views of the structure of FIG. 1A, and depict the varying gate structure having first and second gate stacks, in accordance with one or more aspects of the present invention.

FIG. 2A illustrates the structure of FIG. 1A, taken along line 2A-2A thereof, and varying gate structure 120 extending over fin 110. As shown, in this example, gate structure 120 is in an intermediate stage of fabrication. Spacers 112 may facilitate formation of multiple layers by, for example, containing the material deposited to form each layer. In one example, a gate structure could include a dielectric layer 122, a cap layer 124, and another cap layer 126. Also note that an interfacial layer 121 may be provided between the substrate and dielectric layer 122.

By using a series of protective masks that protect some regions of the substrate structure and expose regions of the substrate structure, a varying gate structure, rather than a uniform gate structure, may be formed, with multiple different gate stacks, such as material layers having varying thicknesses, in multiple different regions, enabling FETs having multiple different threshold voltages. The varying gate structure may enable multiple different threshold voltages because the threshold voltage of a FET is influenced by the electrical properties of the gate, which is located between a channel of the FET and a gate contact that applies a gate voltage to the gate. By sizing or tuning the varying gate structure to have different gate stacks in different regions, different threshold voltages may be achieved, because in a FET, the threshold voltage is directly related to how the gate voltage influences the behavior of charge carriers located in a channel underlying the gate.

In one example, dielectric layer 122 may be a material including silicon, such as silicon dioxide, or silicon oxynitride. In another example, dielectric layer 122 may be a high dielectric constant (high-k) material having a dielectric constant greater than, for example, approximately 3.9 (the dielectric constant of silicon dioxide), including, but not limited to one or more of hafnium oxide, tantalum oxide, zirconium oxide, titanium oxide, or aluminum oxide. In one specific example, dielectric layer 122 may be a high-k material having a thickness of approximately 15 angstroms (Å). Interfacial layer 121 may facilitate formation of dielectric layer 122, and may be, for example, a chemical oxide of the underlying substrate, such as silicon dioxide, having a thickness of approximately 9 Å.

Cap layer 124 may be included to protect dielectric layer 122 from damage during various processing steps. In one example, cap layer 124 may be or include titanium nitride (TiN) or tantalum nitride (TaN), and may have a thickness of approximately between 10 Å and 15 Å, and in one specific example, may be a TiN layer with a thickness of 12 Å.

Each of dielectric layer 122, cap layer 124, and cap layer 126, may be deposited using any of a variety of deposition processes, including, for example, physical vapor deposition (PVD), atomic layer deposition (ALD), chemical vapor deposition (CVD), sputtering, or other processes, depending on the material composition of the layer. The deposition may conform to the substrate structure, including wrapping around fins 110.

Figure 2B:
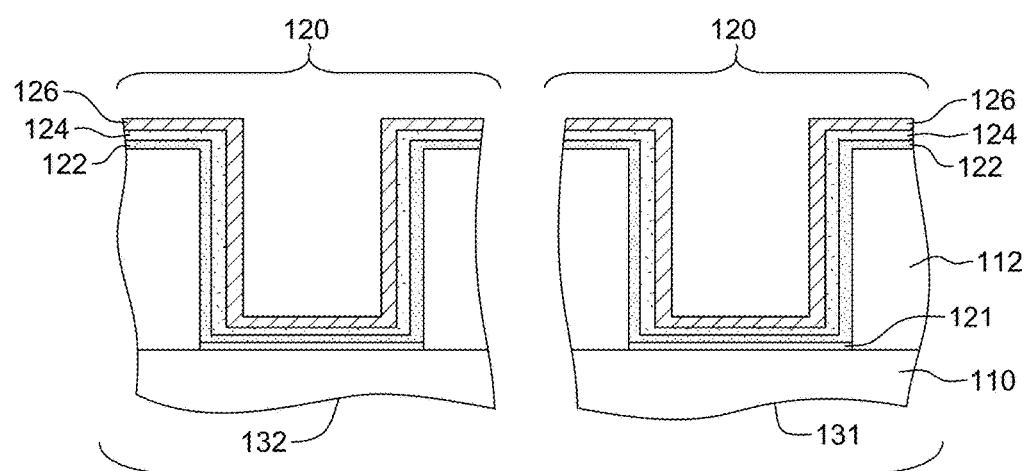

FIG. 2B illustrates the structure of FIG. 1, taken along line 2B-2B thereof. In one embodiment of the fabrication methods disclosed herein, at the stage of fabrication illustrated in FIGS. 2A-2B, gate structure 120 may include similar layers having similar sizes in first region 131 and second region 132. In another example, the sizes and composition of the layers may already vary at the stage of fabrication depicted.

FIGS. 3-5B illustrates one embodiment of a process for sizing a layer of gate structure 120. In this set of examples, a cap layer of gate structure 120 may be sized to have different thicknesses in different regions of the substrate structure. Typically, a cap layer may be used to protect an underlying dielectric layer, and is not ordinarily viewed as influencing the threshold voltage. However, as disclosed herein, varying the size of the cap layer may shift the position of other layers of the varying gate structure, thereby changing the electrical properties thereof. Such a shift in the layers, and change in the electrical properties, can lead to different threshold voltages.

In the process depicted in FIGS. 3-5B, an additive and subtractive process is used to size a cap layer. Such a process may be preferable to an additive only process, because deposition processes used to add material to the cap layer may not be compatible with masking techniques required. However, if appropriate masking techniques may be used, then an additive only process could be used to size the cap layer.

Figure 3:
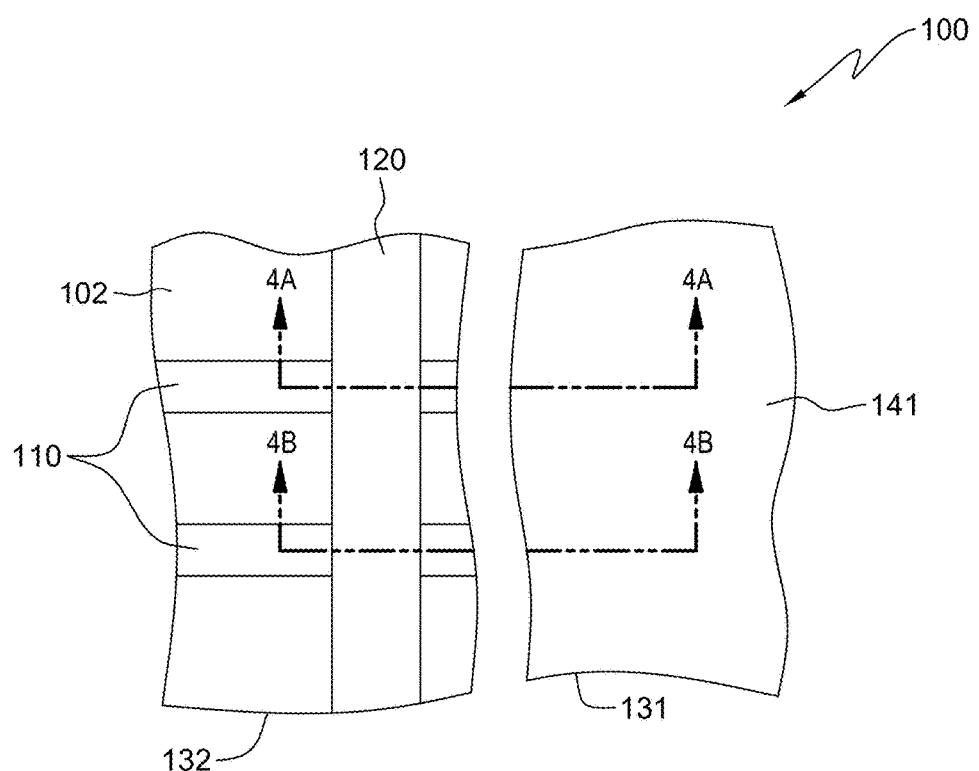
FIG. 3 illustrates the structure of FIGS. 2A-2B after providing a protective mask over a first region of the substrate structure, in accordance with one or more aspects of the present invention.
Figure 4A:
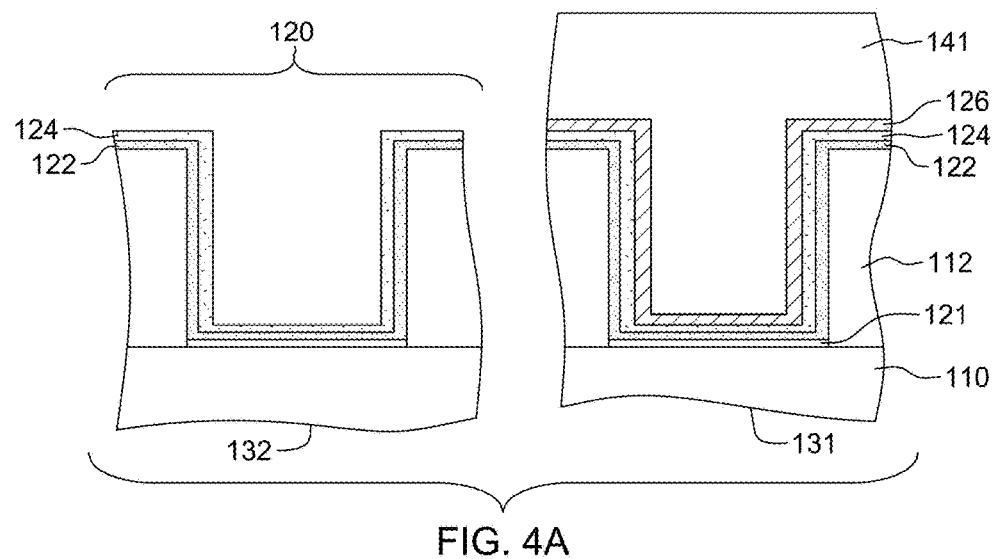
FIGS. 4A-4B depict the structure of FIG. 3 after removing, at least partially, material from a second region of the substrate structure, in accordance with one or more aspects of the present invention.
Figure 4B:
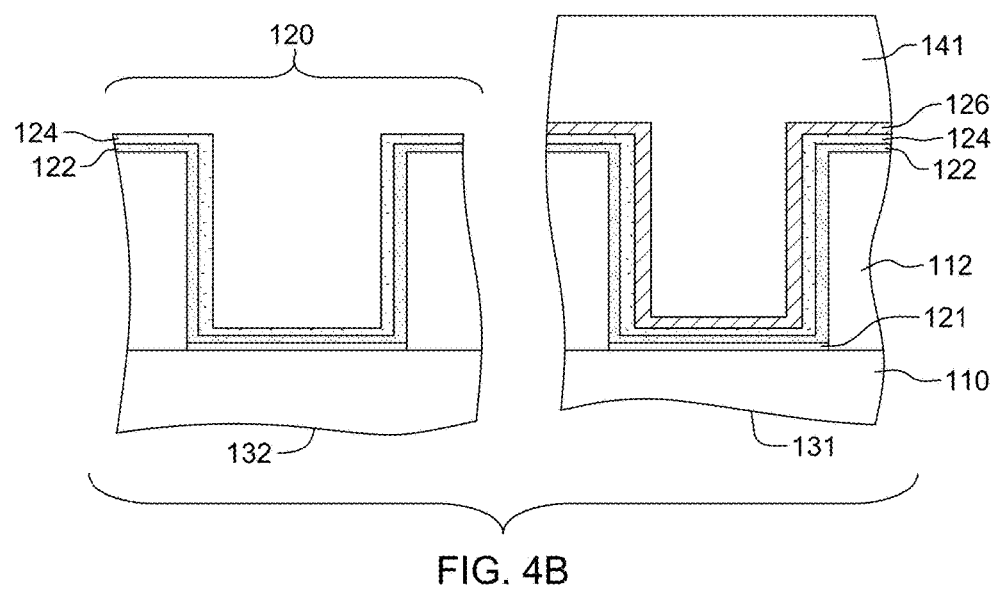

FIG. 3 illustrates the structure of FIGS. 2A-2B after providing a protective mask 141 over first region 131 of the substrate structure, leaving second region 132 exposed to the further processing steps to be disclosed with respect to FIGS. 4A-4B. A protective mask 141 may be provided over the entire circuit structure 100, and then patterned using standard lithographic processing, to reveal second region 132, and protect first region 131. FIG. 3 illustrates one portion of a larger integrated circuit, and first region 131 may be a discontinuous region having many portions protected by protective mask 141, depending upon the specific integrated circuit being fabricated.

In one example, protective mask 141 may include a material such as, for example, silicon nitride, silicon oxide, or silicon oxynitride, and may be deposited using conventional deposition processes, such as, for example, CVD or plasma-enhanced CVD (PECVD). In other examples, other mask materials may be used depending upon the materials used in circuit structure 100. For instance, protective mask 141 may be or include an organic material. For instance, flowable oxide such as, for example, a hydrogen silsesquioxane polymer, or a carbon-free silsesquioxane polymer, may be deposited by flowable chemical vapor deposition (F-CVD). In another example, protective mask 141 may be or include an organic polymer, for example, polyacrylate resin, epoxy resin, phenol resin, polyamide resin, polyimide resin, unsaturated polyester resin, polyphenylene ether resin, polyphenylenesulfide resin or benzocyclobutene (BCB).

FIG. 4A illustrates the structure of FIG. 3, taken along line 4A-4A thereof, and FIG. 4B illustrates the structure of FIG. 3, taken along line 4B-4B thereof. As depicted, in one example, a process for sizing cap layer 126 includes removing material of cap layer 126 from second region 132 of the substrate structure, and leaving unchanged cap layer 126 in first region 131. In another example, the material may be removed partially, in order to reduce a thickness of cap layer 126 in second region 132.

Removing cap layer 126 may be achieved by any suitable etching process, such as dry or wet etching processing. In one example, isotropic dry etching may be used by, for example, ion beam etching, plasma etching or isotropic RIE. In another example, isotropic wet etching may also be performed using etching solutions selective to the material of cap layer 126. Protective mask 141 ensures that material of cap layer 126 is not removed from first region 131 during such a removal process.

Figure 5A:
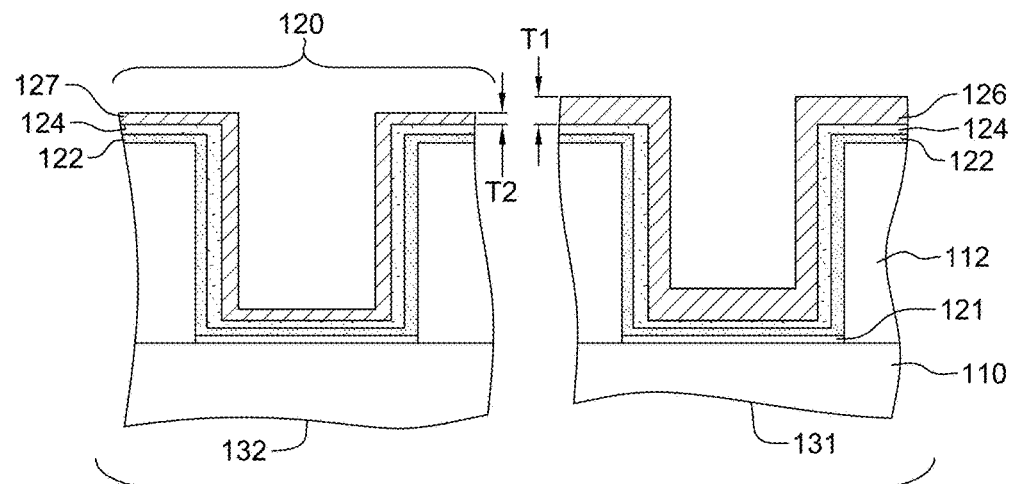
FIGS. 5A-5B depict the structure of FIGS. 4A-4B after sizing one layer of the varying gate structure, in accordance with one or more aspects of the present invention.
Figure 5B:
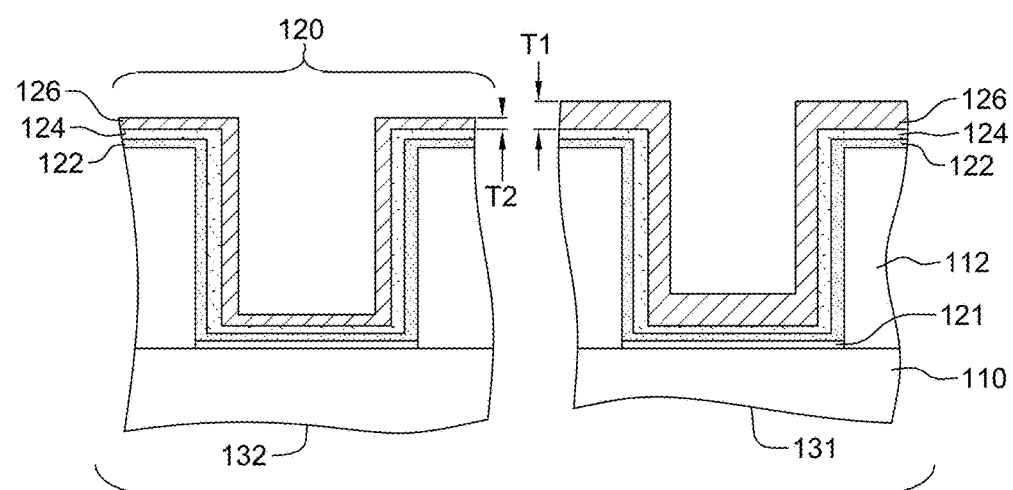

FIGS. 5A-5B illustrate the structure of FIGS. 4A-4B after removing the protective mask and depositing material of cap layer 126 over first region 131 and second region 132 of the substrate structure. In one example, as depicted, depositing the material provides cap layer 126 with a first thickness $T_1$ in first region 131, and a second thickness $T_2$ in second region 132. As depicted $T_1$ may be greater than $T_2$, but in another example, $T_2$ may be greater than $T_1$. The material may be deposited by variety of deposition processes, including, for example, physical vapor deposition (PVD), atomic layer deposition (ALD), or chemical vapor deposition (CVD). For example, cap layer 126 may be or include TiN or TaN, and have a thickness between 10 Å and 18 Å. In one specific example, cap layer 126 may be TaN, and have thickness $T_1$ of between 15 Å and 18 Å in first region 131, and thickness $T_2$ of 10 Å in second region 132.

Removing the protective mask may be achieved using any suitable process, such as chemical-mechanical polishing (CMP), or etching, depending on the chemistry of the protective mask.

FIGS. 6A-9B illustrate examples of a process of sizing (or varying) another layer of gate structure 120. In these examples, a work-function layer of varying gate structure 120 may be sized to have different thicknesses in different regions of the substrate structure, enabling different gate stacks in the different regions. For a conductor, the work-function is an electrical property that describes the minimum energy required to remove an electron from the conductor. A work-function layer of a gate structure, therefore, is a material layer that directly impacts the threshold voltage because it influences the amount of energy required for electrons to flow from the gate stack to a gate contact, and thereby influences the amount of energy available to attract charge carriers in a channel underlying the gate. In addition, the previously described process of sizing a cap layer may influence the vertical position of the after formed work-function layer with respect to the underlying channel. These different factors work together to allow the creation of a varying gate structure defining different threshold voltages.

Figure 6A:
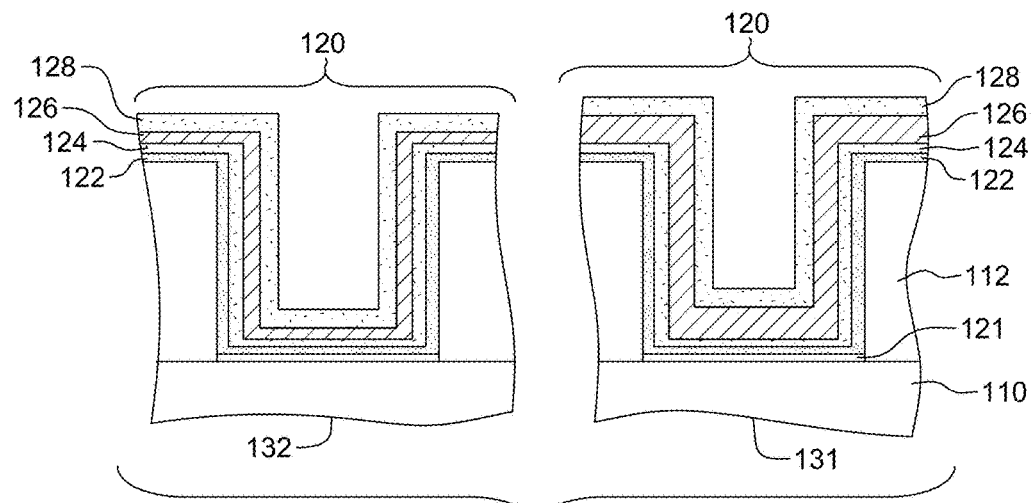
FIGS. 6A-6B depict the structure of FIGS. 5A-5B after depositing, at least partially, another material of another layer over the substrate structure, in accordance with one or more aspects of the present invention.
Figure 6B:
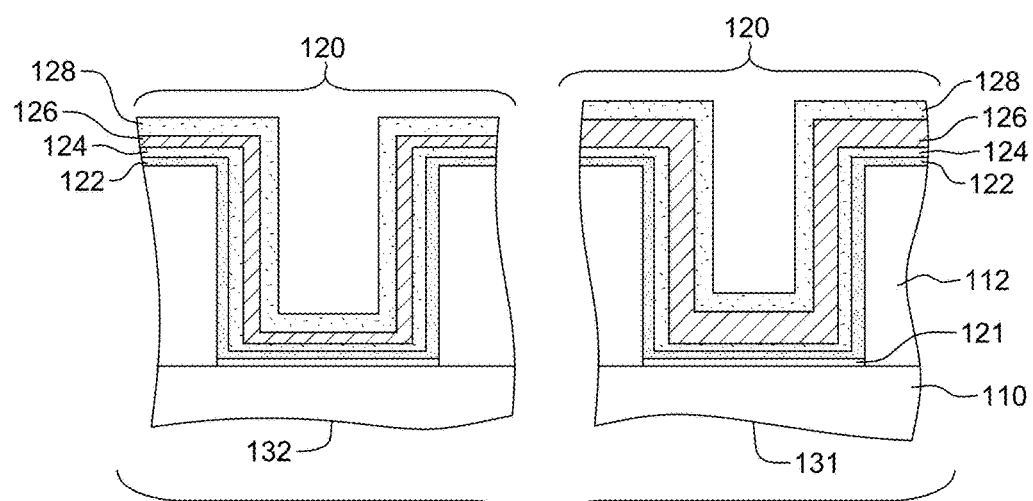

FIGS. 6A-6B illustrate the structure of FIGS. 5A-5B after depositing a material of a work-function layer 128 over first region 131 and second region 132. The material of work-function layer 128 may be formed using any of the deposition processes described for depositing cap layer 126, with respect to FIGS. 5A-5B.

Work-function layer 128 may be or include metals and their nitrides, such as titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN). In another example, work-function layer 128 may be or include metals and their carbides, such as titanium carbide (TiC), titanium aluminum carbide (TiAlC), titanium aluminide (TiAl) tantalum carbide (TaC), tantalum aluminum carbide (TaAlC), niobium carbide (NbC), vanadium carbide (VC), etc. In another example, work-function layer 128 may also include ruthenium (Ru), platinum (Pt), molybdenum (Mo), cobalt (Co) and alloys and combinations thereof.

Figure 7:
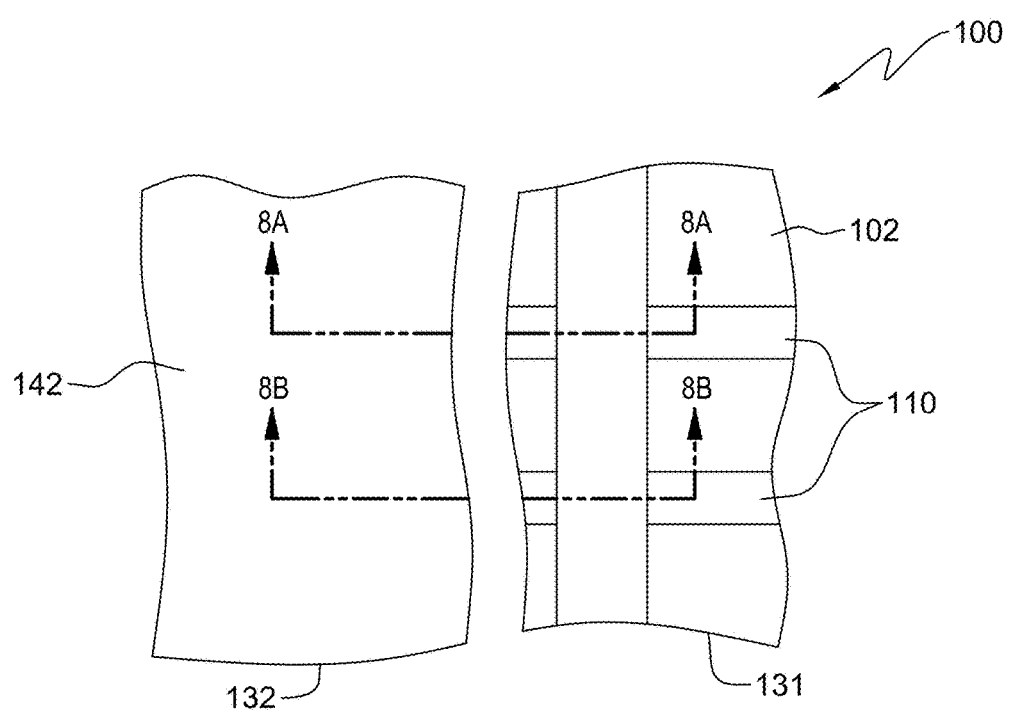
FIG. 7 illustrates the structure of FIGS. 6A-6B after providing a protective mask over the second region of the substrate structure, in accordance with one or more aspects of the present invention.
Figure 8A:
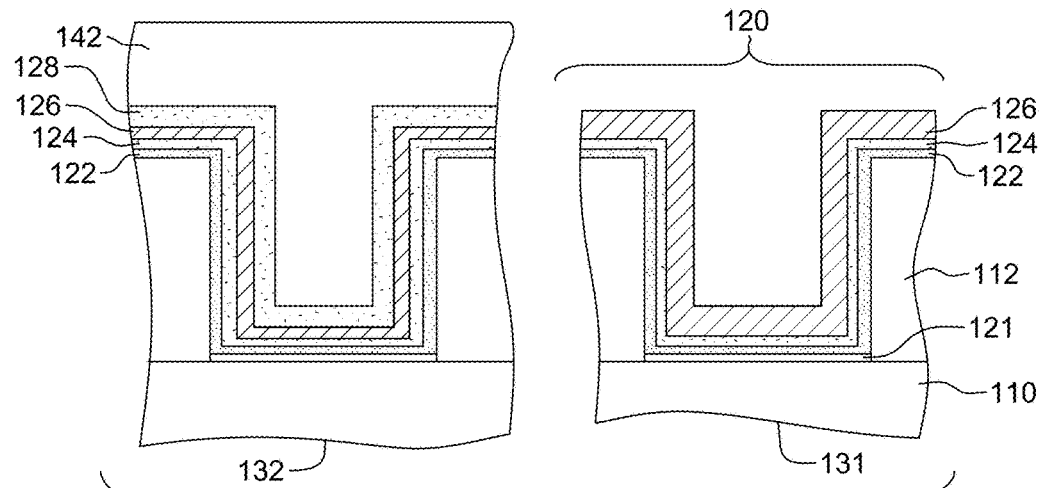
FIGS. 8A-8B depict the structure of FIG. 7 after removing, at least partially, the other material from the first region of the substrate structure, in accordance with one or more aspects of the present invention.
Figure 8B:
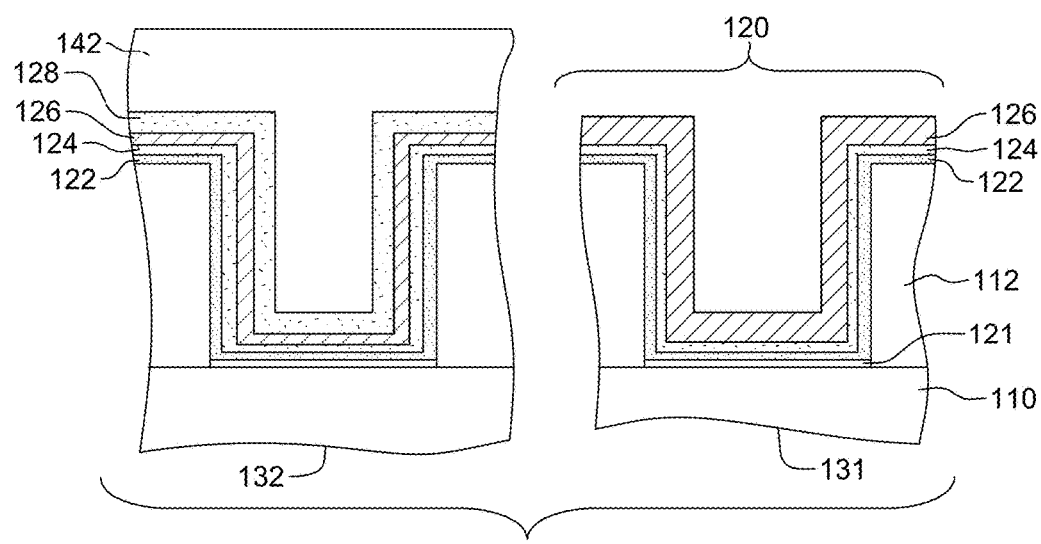

FIG. 7 illustrates the structure of FIGS. 6A-6B after providing another protective mask 142 over second region 131 of the substrate structure, leaving first region 131 exposed to the further processing steps to be disclosed with respect to FIGS. 8A-8B. Protective mask 142 may have any of the properties previously described with respect to the protective mask of FIG. 3.

FIG. 8A illustrates the structure of FIG. 7, taken along line 8A-8A thereof, and FIG. 8B illustrates the structure of FIG. 7, taken along line 8B-8B thereof. As depicted, in one example, a process for sizing work-function layer 128 includes removing material of work-function layer 128 from first region 132 of the substrate structure. In another example, the material may be removed partially, in order to reduce a thickness of work-function layer 128 in first region 131. Removing work-functional layer 128 may be achieved using any of the removal processes described for removing cap layer 126 with respect to FIGS. 4A-4B.

Figure 9A:
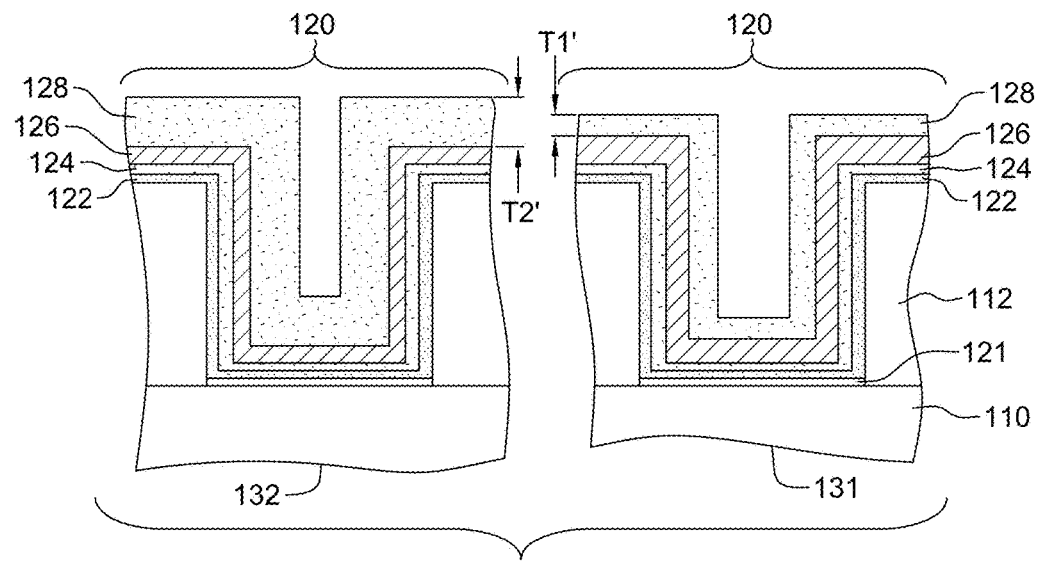
FIGS. 9A-9B depict the structure of FIGS. 8A-8B after sizing the other layer of the varying gate structure, in accordance with one or more aspects of the present invention.
Figure 9B:
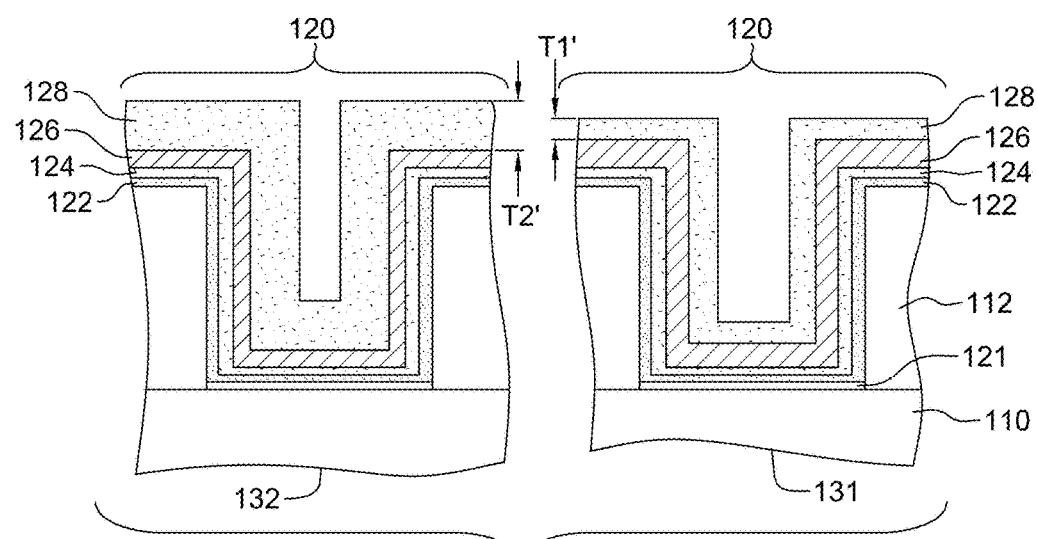

FIGS. 9A-9B illustrate the structure of FIGS. 8A-8B after removing the other protective mask and depositing the material of work-function layer 128 over first region 131 and second region 132. In one example, as depicted, depositing the material forms a first thickness $T'_1$ of work-function layer 128 in first region 131, and a second thickness $T'_2$ in second region 132. As depicted $T'_2$ may be greater than $T'_1$, but in another example, $T'_1$ may be greater than $T'_2$. Depositing material of work-function layer 128 may be accomplished using the techniques previously described with respect to FIGS. 6A-6B.

For example, work-function layer 128 may be or include TiN or TiC and may have a thickness of approximately between 20 Å and 60 Å. In one specific example, work-function layer 128 may be a TiN layer with thickness $T'_2$ in second region 132 of approximately 20 Å, and thickness of $T'_1$ in first region of approximately 40 Å. In such an example, along with sized cap layer 126, the first gate stack may define a first threshold voltage for a FET in first region 131 of approximately 0.35 V and a second threshold voltage for another FET in second region 132 of approximately 0.25 V, that are different by between 80 and 120 milivolts.

Figure 10:
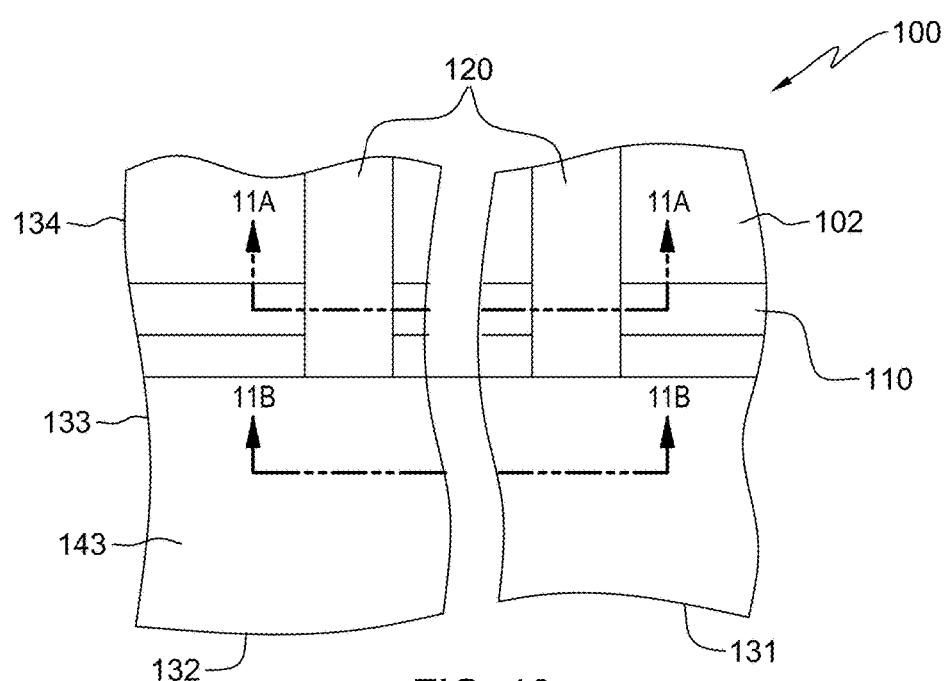
FIG. 10 illustrates the structure of FIGS. 9A-B after providing a protective mask over a third region of the substrate structure, in accordance with one or more aspects of the present invention.
Figure 11A:
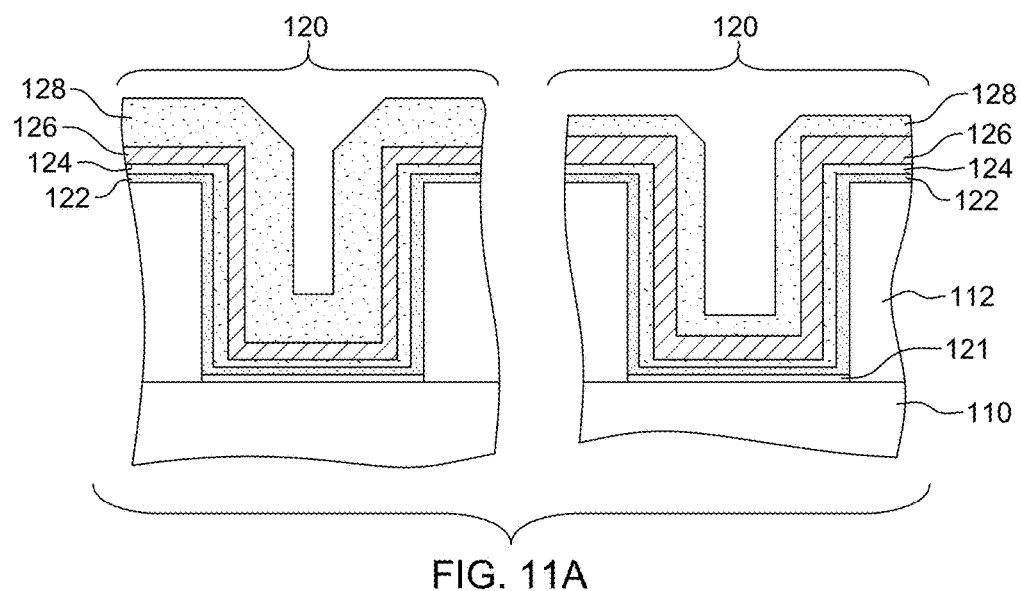
FIG. 11A depicts the structure of FIG. 10 after chamfering the other layer of the varying gate structure in a fourth region of the substrate structure, in accordance with one or more aspects of the present invention.

FIG. 10 illustrates the structure of FIGS. 9A-9B after providing another protective mask 143 over a third region 133 of the substrate structure, leaving a fourth region 134 of the substrate structure exposed to the further processing steps to be disclosed with respect to FIG. 11A. As illustrated, third region 133 and fourth region 134 each overlap first region 131 and second region 132. In one example, varying gate structure 120 may have one gate stack in third region 133 to provide a threshold voltage for PFETs, and another gate stack in fourth region 134 to provide a different threshold voltage for NFETs. By using protective masks and overlapping regions, varying gate structure 120 can have different layers of different thickness in numerous regions, allowing for any number of threshold voltages to be defined, as required by the circuit design.

FIG. 11A illustrates the structure of FIG. 10 after chamfering work-function layer 128 in the fourth region of the substrate structure. Work-function layer 128 may optionally be chamfered to remove sharp corners, in order to facilitate subsequent processing steps, because narrow openings of gate structure 120 may make it difficult to deposit further materials. Chamfering may be achieved by any appropriate etching process, such as isotropic etching.

Figure 11B:
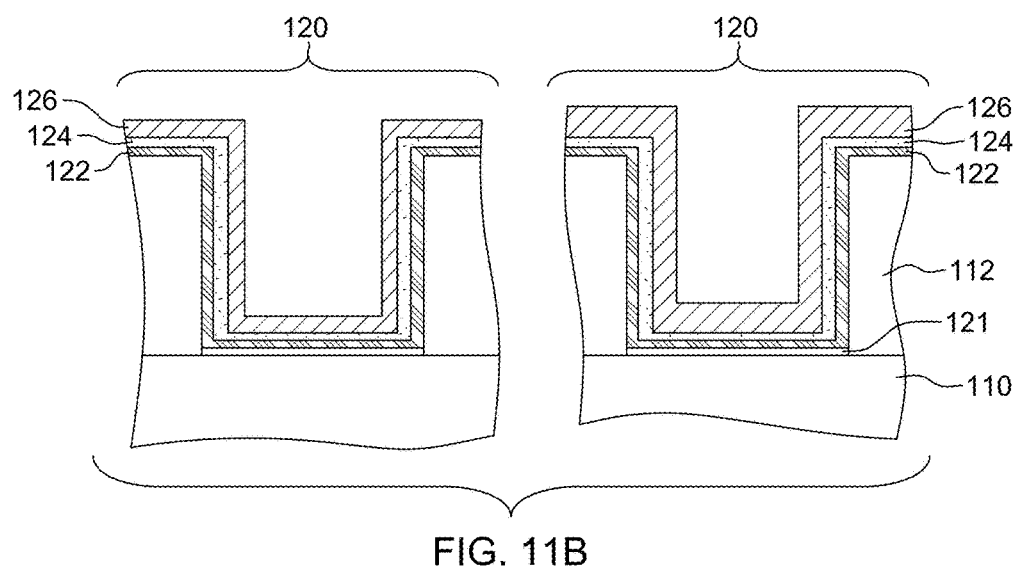
FIG. 11B depicts the structure of FIG. 10 after sizing the other layer of the varying gate structure in the third region of the substrate structure, in accordance with one or more aspects of the present invention.

FIG. 11B illustrates the structure of FIG. 10 after removing the work-function layer in the third region of the substrate structure. To remove the work-function layer, a protective mask may be provided over the fourth region of the substrate structure and a removal process may be employed in a like manner as previously described with respect to FIGS. 7-8B. In another example, only a portion of the work-function layer may be removed.

Figure 12A:
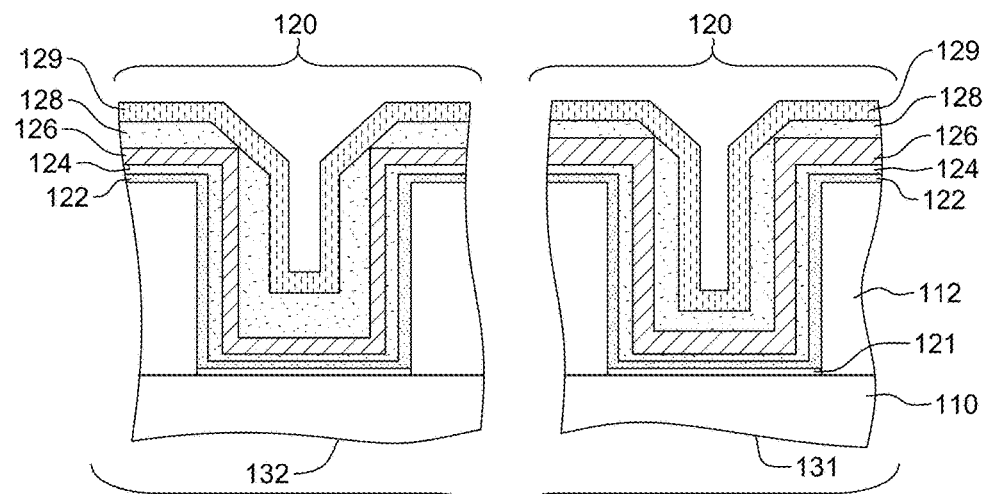
FIGS. 12A-12B depict the structure of FIGS. 11A-11B after providing another layer over the substrate structure, in accordance with one or more aspects of the present invention.
Figure 12B:
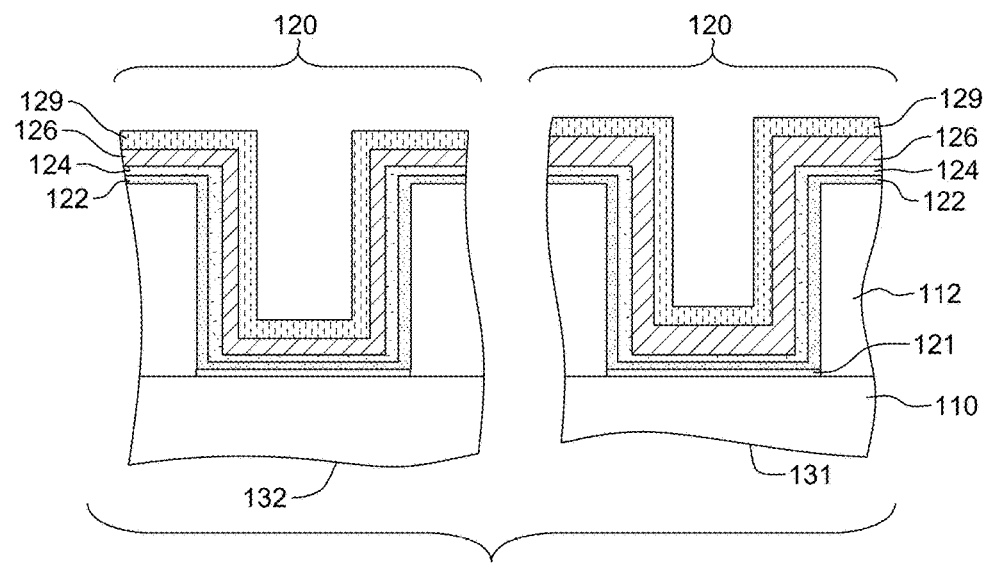

FIGS. 12A-12B illustrate the structure of FIGS. 11A-11B after providing another layer 129 over the substrate structure. In one example, other layer 129 may be a work-function layer, and may be the same or a different material as work-function layer 128. Using the techniques previously described, other layer 129 may be sized with different thicknesses in different regions of the substrate structure.

Figure 13A:
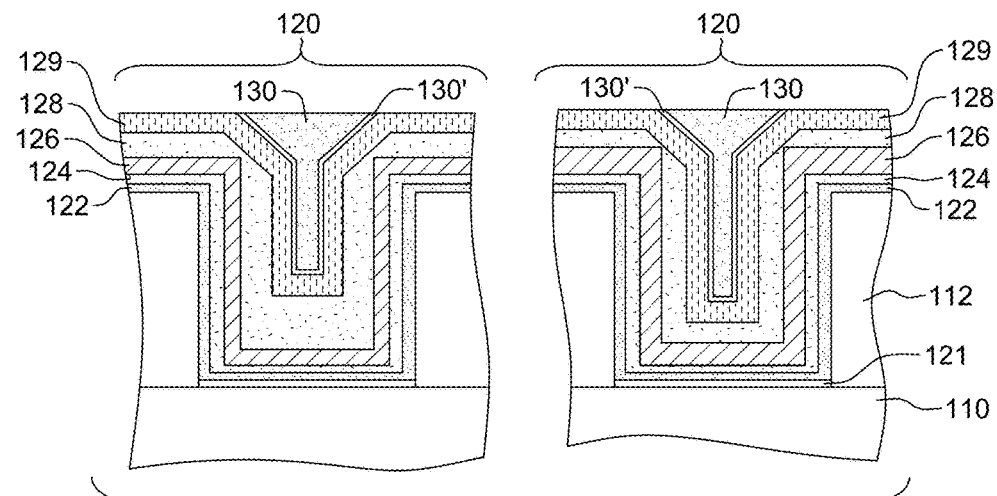
FIG. 13A-13B depict the structure of FIGS. 12A-12B after filling the varying gate structure with another material, in accordance with one or more aspects of the present invention.
Figure 13B:
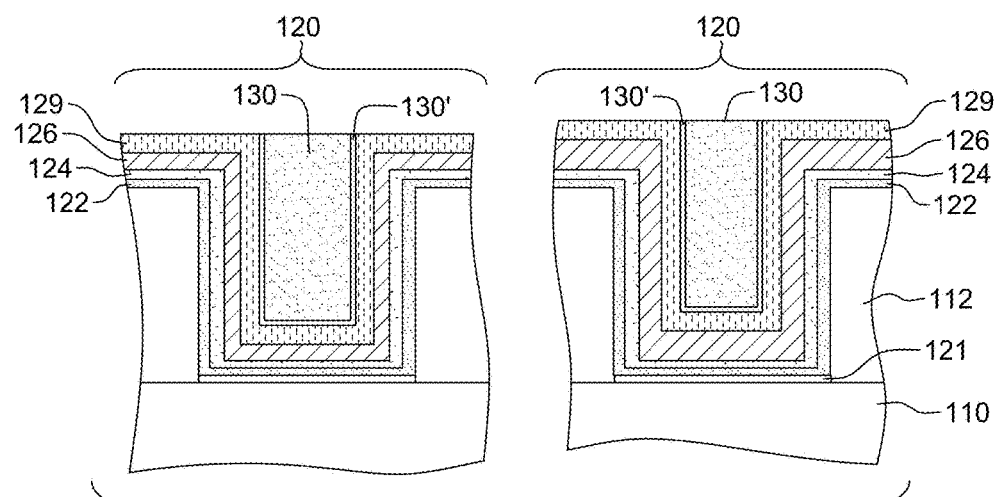

FIGS. 13A-13B illustrate the structure of FIGS. 12A-12B after depositing an encapsulation layer 130' and filling varying gate structure 120 with a material 130. In one example, material 130 may be any suitable material, including a metal, such as tungsten (W). Encapsulation layer 130' may be needed to protect the underlying gate stack from mechanical damage or diffusion of material 130, and may be, in one specific example, TiN having a thickness of 20 Å. Because of the varying total height of varying gate structure 120, a sufficient amount of material 130 may be deposited to completely fill gate structure 120. After filling the gate structure 120 with material 130, the circuit structure may be subjected to a chemical mechanical polishing (CMP) process to remove extra gate stack material from various portions of the circuit structure.

As illustrated, varying gate structure 120 may have different layers of materials, including work-function and cap layers, having different sizes in various regions of the substrate structure. Taken together, FIGS. 13A-13B illustrate four different gate stacks of varying gate structure 120 having four different size profiles, allowing for four different threshold voltages. As may be readily understood, by applying the techniques disclosed herein, varying gate structure 120 may be tuned in additional regions to yield additional different gate stacks, and therefore, different threshold voltages, including for example additional different pairs of threshold voltages for NFETs and PFETs.

In addition, under certain circumstances, it may be desirable to further tune the threshold voltages achieved using the varying gate structure described herein, by implanting impurities, such as n-type or p-type dopants, within portions of the circuit structure, such as a channel region underlying the gate structure, or the various layers described. Such tuning may be achieved by plasma doping or ion implantation of the circuit structure using various materials.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A device comprising:
    an integrated circuit, the integrated circuit comprising:
        a varying gate structure disposed over a substrate structure, the varying gate structure comprising a first gate stack in a first region of the substrate structure, a second gate stack in a second region of the substrate structure, a third gate stack in a third region of the substrate structure, and a fourth gate stack in a fourth region of the substrate structure, wherein the first gate stack, second gate stack, third gate stack and fourth gate stack are different gate stacks;
        a first field-effect transistor in the first region of the substrate structure, the first field-effect transistor comprising the first gate stack of the varying gate structure and having a first threshold voltage; and
        a second field-effect transistor in the second region of the substrate structure, the second field-effect transistor comprising the second gate stack of the varying gate structure and having a second threshold voltage, wherein the first threshold voltage is different from the second threshold voltage,
        a third field-effect transistor in the third region of the substrate structure, the third field-effect transistor comprising the first gate stack of the varying gate structure and having a third threshold voltage different than the first and second threshold voltages; and
        a fourth field-effect transistor in the fourth region of the substrate structure, the fourth field-effect transistor comprising the fourth gate stack of the varying gate structure and having a fourth threshold voltage that is different from the first, second and third threshold voltages,
    wherein the first gate stack and the second gate stack of the varying gate structure comprises a gate dielectric layer, a first cap layer overlying the gate dielectric layer, a second cap layer overlying the first cap layer, a first work-function layer overlying the second cap layer, and a metal layer overlying the second work function layer,
    wherein the second cap layer has a first thickness in the first gate stack and a second thickness in the second gate stack that is different from the first thickness,
    wherein the first gate stack and the second gate stack of the varying gate structure comprises the layers of the first and second gate stacks and a second work function layer positioned between the second conductive cap layer and the first work function layer, and
    wherein the second cap layer has the first thickness in the third gate stack and the second thickness at the fourth gate stack, and
    wherein the second work function layer has a first thickness in the third gate stack and a second thickness in the fourth gate stack that is different from the first thickness.

2. The device of claim 1, wherein the first work function layer has a third thickness in the first region and a fourth thickness in the second region that is different from the third thickness.

3. The device of claim 2, wherein the first thickness is less than the second thickness, and the third thickness is greater than the fourth thickness.

4. The device of claim 1, wherein a portion of the varying gate structure extends from the first field-effect transistor to the second field-effect transistor.

5. The device of claim 1, wherein the first threshold voltage is between 80 and 120 millivolts greater than the second threshold voltage.

6. The device of claim 1, wherein the substrate structure comprises a first fin extending over the first and second regions of the substrate structure and a second fin extending over the second third and fourth regions of the substrate structure, and the varying gate structure is conformally disposed over the first fin and the second fin.

7. The method of claim 6, wherein a portion of the varying gate structure extends from the first field-effect transistor to the second field-effect transistor.

8. The device of claim 6, wherein the first fin and the second fin are a common fin.

9. The device of claim 1, wherein the first gate stack, second gate stack, third gate stack and fourth gate stack of the varying gate structure further comprise an interfacial layer disposed between the substrate and the dielectric layer.

10. The device of claim 1, wherein the first cap layer has substantially the same thickness in the first gate stack, second gate stack, third gate stack and fourth gate stack.

11. The device of claim 10, wherein the thickness of the first cap layer in the first gate stack, second gate stack, third gate stack and fourth gate stack is between about 10 Å and about 15 Å.

12. The device of claim 1, wherein the first thickness and the second thickness of the second cap layer is between 10 Å and 15 Å.

13. The device of claim 1, wherein the first cap layer comprises TiN or TaN.

14. The device of claim 1, wherein the second cap layer comprises TiN or TaN.

15. The device of claim 2, wherein the gate dielectric layer is proximate to the substrate structure.

16. The device of claim 1, wherein the first gate stack, the second gate stack, the third gate stack and the fourth gate stack are formed over a fin formed on the substrate structure.

17. The device of claim 16, wherein the first gate stack, the second gate stack, the third gate stack and the fourth gate stack are formed on respective pairs of spaced spacers formed on the fin.

18. The device of claim 16, wherein the inner side walls of the pairs of spacers and the respective portions of the fin extending between the spacers of the pairs of spacers form channels, and wherein the first gate stack, the second gate stack, the third gate stack and the fourth gate stack are formed over the channel.

19. The device of claim 18, wherein an oxide layer extends on the respective portions of the fin extending between the spacers of the pairs of spacers, wherein the dielectric layer is formed on the inner side walls of the pairs of spacers and the oxide layer at the first gate stack, the second gate stack, the third gate stack and the fourth gate stack.

20. The device of claim 19, wherein the first gate stack and the second gate stack are formed over a first fin formed on the substrate structure, and the third gate stack and the fourth gate stack are formed over a second fin formed on the substrate structure.

* * * * *